(12) United States Patent
Chih-Sheng

(10) Patent No.: US 8,847,666 B2
(45) Date of Patent: Sep. 30, 2014

(54) RF SWITCH WITH RF PATHWAY CHARGE-DISCHARGE CIRCUIT AND ASSOCIATED METHOD

(75) Inventor: Chen Chih-Sheng, Taipei (TW)

(73) Assignee: RichWave Technology Corp., NeiHu District, Taipei (TW)

( * ) Notice: Subject to any disclaimer, the term of this patent is extended or adjusted under 35 U.S.C. 154(b) by 156 days.

(21) Appl. No.: 13/597,611

(22) Filed: Aug. 29, 2012

(65) Prior Publication Data

US 2014/0062218 A1     Mar. 6, 2014

(51) Int. Cl.
     *H03K 17/687*      (2006.01)

(52) U.S. Cl.
     USPC ........................................ 327/427; 327/407

(58) Field of Classification Search
     USPC ................. 327/392–394, 398, 399, 427, 407
     See application file for complete search history.

(56) References Cited

U.S. PATENT DOCUMENTS 5,903,178 A * 5/1999 Miyatsuji et al. ............. 327/308
7,199,635 B2 * 4/2007 Nakatsuka et al. ........... 327/308

* cited by examiner

*Primary Examiner* — Hai L Nguyen
(74) *Attorney, Agent, or Firm* — Winston Hsu; Scott Margo (57) ABSTRACT

A radio frequency (RF) switch includes a common port, a first port, and a second port, a first semiconductor switching element disposed in a first RF pathway between the common port and the first port, a second semiconductor switching element disposed in a second RF pathway between the common port and the second port, a first pair of direct current (DC) blocking capacitors disposed to isolate the first semiconductor switching element in the first RF pathway, and a second pair of DC blocking capacitors disposed to isolate the second semiconductor switching element in the second RF pathway. The respective pairs of DC blocking capacitors allow for different bias voltages to be applied to the respective RF pathways. A charge-discharge circuit may also be employed to decrease transient switching time of the RF switch.

20 Claims, 8 Drawing Sheets

FIG.8

RF SWITCH WITH RF PATHWAY CHARGE-DISCHARGE CIRCUIT AND ASSOCIATED METHOD

FIELD OF THE INVENTION

The present invention relates to solid state radio frequency (RF) switches. More particularly, the present invention relates to an approach for biasing elements of an RF switch to achieve higher power handling capability and faster switching time.

BACKGROUND OF THE INVENTION

RF switches are important building blocks in many wired and wireless communication systems. Solid state RF switches are found in many different communication devices such as cellular telephones, wireless pagers, wireless infrastructure equipment, satellite communications equipment, and cable television equipment. As is well known, the performance of solid state RF switches may be characterized by one of any number operating performance parameters including insertion loss and switch isolation. Performance parameters are often tightly coupled, and any one parameter can be emphasized in the design of RF switch components at the expense of others. Other characteristics that are important in RF switch design include ease and degree (or level) of integration of the RF switch, complexity, yield, return loss and, of course, cost of manufacture.

Still other performance characteristics associated with RF switches is power handling capability and switching speed. When the power handling capability of an RF switch is low, the RF switch might not be able to isolate one path from another if the input signal is too great. That is, the peak-to-peak voltage swing of an input signal might be sufficiently high to overcome the reverse bias of a given transistor or transistor group, thus effectively causing such a transistor or transistor group that has been placed in an OFF state (reverse bias state) to be in an undesirable ON state, and effectively ruin the switching capability of the RF switch.

In addition, there is a continued desire to improve upon the switching speed of an RF switch.

SUMMARY OF THE INVENTION

Embodiments of the present invention provide a radio frequency (RF) switch that includes a common port, a first port, and a second port. A first semiconductor switching element is disposed in a first RF pathway between the common port and the first port, and a second semiconductor switching element is disposed in a second RF pathway between the common port and the second port. A first pair of direct current (DC) blocking capacitors is disposed to isolate the first semiconductor switching element in the first RF pathway, and a second pair of DC blocking capacitors is disposed to isolate the second semiconductor switching element in the second RF pathway. The respective pairs of DC blocking capacitors allow for different bias voltages to be applied to the respective RF pathways and as a result increase the permissible input signal amplitude to the RF switch. A charge-discharge circuit may also be employed to decrease transient switching time of the RF switch by enabling a low resistance path between (1) respective source and drain nodes of the semiconductor switching elements and corresponding DC blocking capacitors and (2) appropriate voltage sources, thus enabling relative quick charging and dis-charging of said capacitors. The charge-discharge circuit may be engaged for a very short time upon detection of gate control signal used to enable or disable a given one of the RF pathways of the RF switch.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF THE PREFERRED EMBODIMENTS

Figure 1:
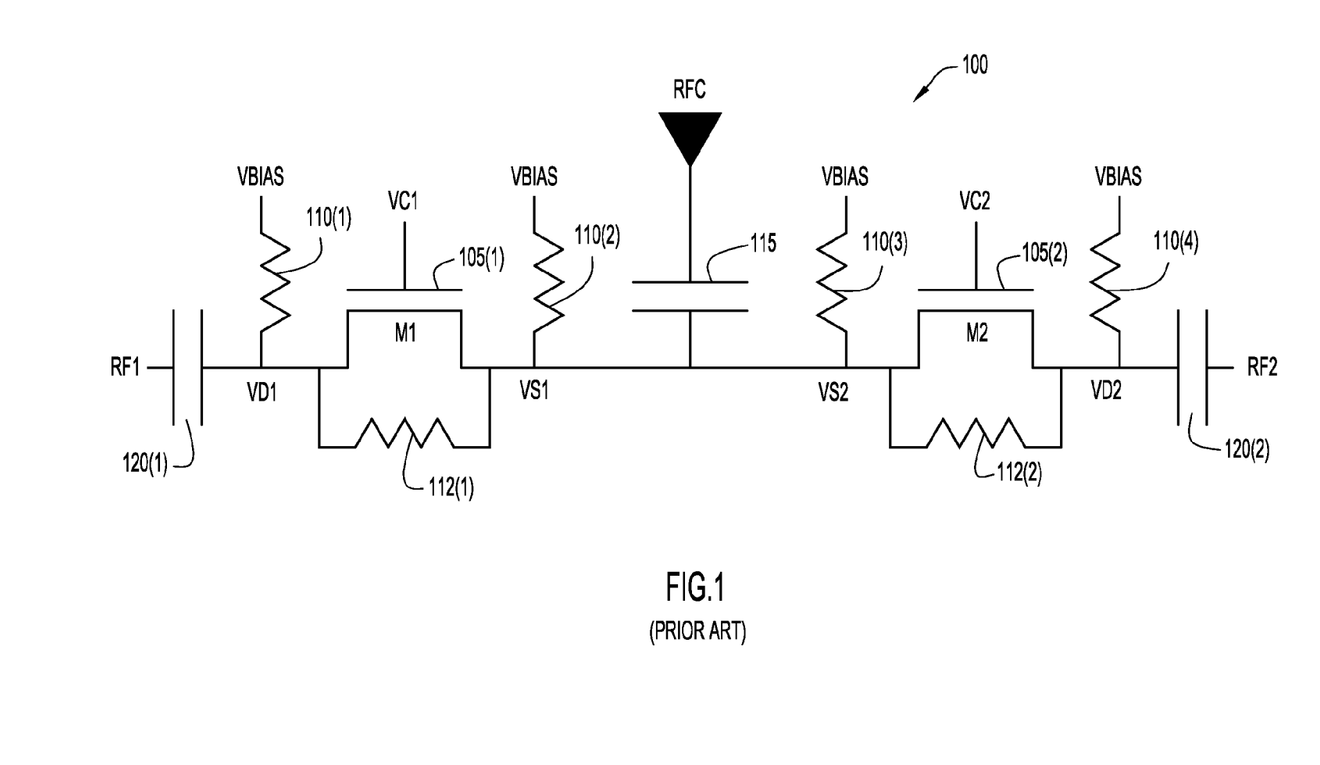
FIG. 1 shows a conventional RF switch including application of a constant BIAS voltage to source and drain nodes of a switching element.

Reference is now made to FIG. 1, which depicts a conventional RF switch 100. RF switch 100 includes a port RFC (radio frequency common), a first port RF1 and a second port RF2. A first semiconductor switching element M1 is disposed between port RFC and first port RF1, and a second semiconductor switching element M2 is disposed between port RFC and second port RF2. Switching elements M1 and M2 may be, for example, MOSFET devices having respective source nodes (VS1, VS2), drain nodes (VD1, VD2) and gate control nodes (105(1), 105(2)). Although MOSFET devices are described herein as the semiconductor switching elements, the switching elements may alternatively comprise bipolar transistors among other semiconductor switching elements.

Resistors 110(1)-110(4) are connected to each of the source and drain nodes, and a bias voltage VBIAS is applied to the respective source and drain nodes. As will be explained below, VBIAS is a constant voltage, the application of which enables RF switch 100 to accommodate AC input signals applied to port RFC.

In addition, RF switch 100 includes resistors 112(1), 112(2) connecting the source and drain nodes of the respective switching elements M1, M2. Finally, RF switch 100 includes several DC blocking capacitors 115, 120(1) and 120(2). DC blocking capacitor 120 isolates port RFC from the source nodes VS1, VS2 of switching elements M1 and M2. DC blocking capacitors 120(1), 120(2) isolate ports RF1 and RF2 from respective drain nodes VD1, VD2.

RF switch 100 operates as follows. With reference to Table 1 below, if it is desired to have an RF signal pass from port RFC to RF1, switching element M1 is turned ON (such that an AC signal can pass therethrough) and switching element M2 is turned OFF (such that an AC signal cannot pass therethrough). This is accomplished by applying, in the case of a MOSFET, a 3.3 volt control signal VC1 to gate node 105(1) of switching element M1 and simultaneously applying a 0 volt control signal VC2 to gate node 105(2) of switching element M2. Simultaneously, a constant bias signal VBIAS of 1.65 volts is supplied through resistors 110(1)-110(4) to the respective source nodes (VS1, VS2) and drain nodes (VD1, VD2) of switching elements M1 and M2.

TABLE 1

|  | VC1 | VD1 = VS1 | VGS of M1 | VC2 | VD2 = VS2 | VGS of M2 |
| --- | --- | --- | --- | --- | --- | --- |
| RFC-RF1 | 3.3 V | 1.65 V | 1.65 V | 0 V | 1.65 V | −1.65 V |
| RFC-RF2 | 0 V | 1.65 V | −1.65 V | 3.3 V | 1.65 V | 1.65 V |

In this configuration, VGS of switching element M1 is 1.65 volts (3.3-1.65) and VGS of switching element M2 is −1.65 volts (0-1.65). Accordingly, switching element M1 is turned ON wherein the RF pathway between ports RFC and RF1 is enabled, and M2 is turned OFF wherein the RF pathway between ports RFC and RF2 is disabled.

To have an RF signal supplied at port RFC pass to port RF2 (or vise versa), the opposite control signaling is applied to control signals VC1 and VC2. Specifically, a 0 volt control signal VC1 is applied to gate node 105(1) of switching element M1 and, simultaneously, a 3.3 volt control signal VC2 is applied to gate node 105(2) of M2. In this configuration (port RFC→port RF2), VGS of switching element M1 is −1.65 volts (OFF) and VGS of switching element M2 is 1.65 volts (ON).

Figure 3:
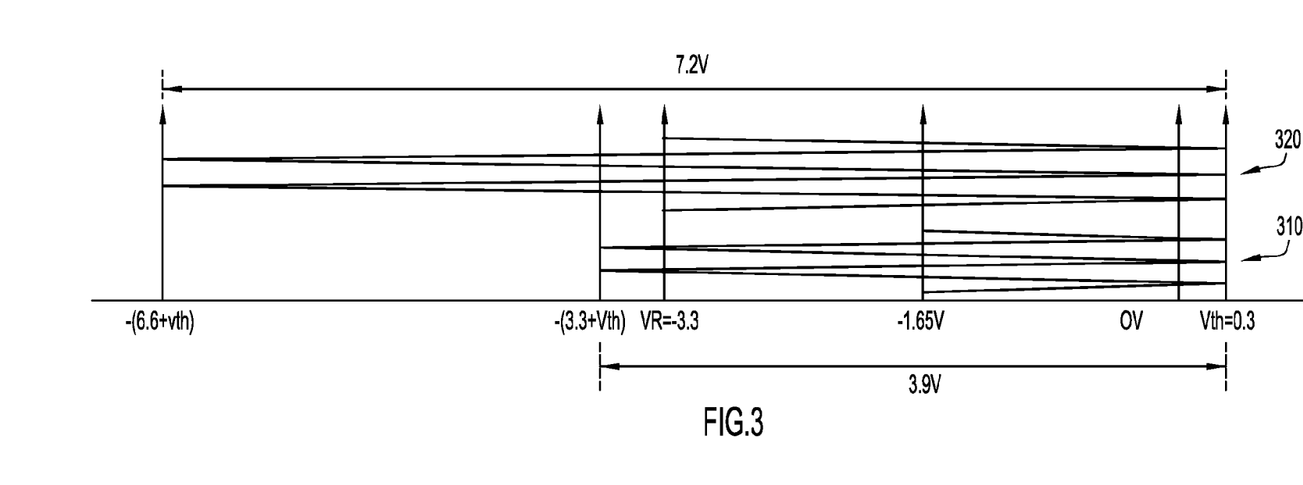
FIG. 3 shows the permissible voltage swing of an input signal to the conventional RF switch of FIG. 1 compared to the permissible voltage swing of an RF switch in accordance with an embodiment of the present invention.

Based on the foregoing, those skilled in the art will appreciate that the maximum voltage swing that can be handled by RF switch 100 of FIG. 1 is 3.3 volts plus twice (i.e., 2 times) the threshold voltage (0.3 volt) of switching elements M1 or M2, i.e., the maximum input voltage swing is approximately 3.9 volts. FIG. 3 depicts the maximum voltage swing of RF switch 100 at 310. That is, a signal input to port RFC of RF switch 100 beyond plus/minus 1.95 volts (centered around −1.65 volts) will swamp or overwhelm the switching element that is set in its OFF state.

Figure 2:
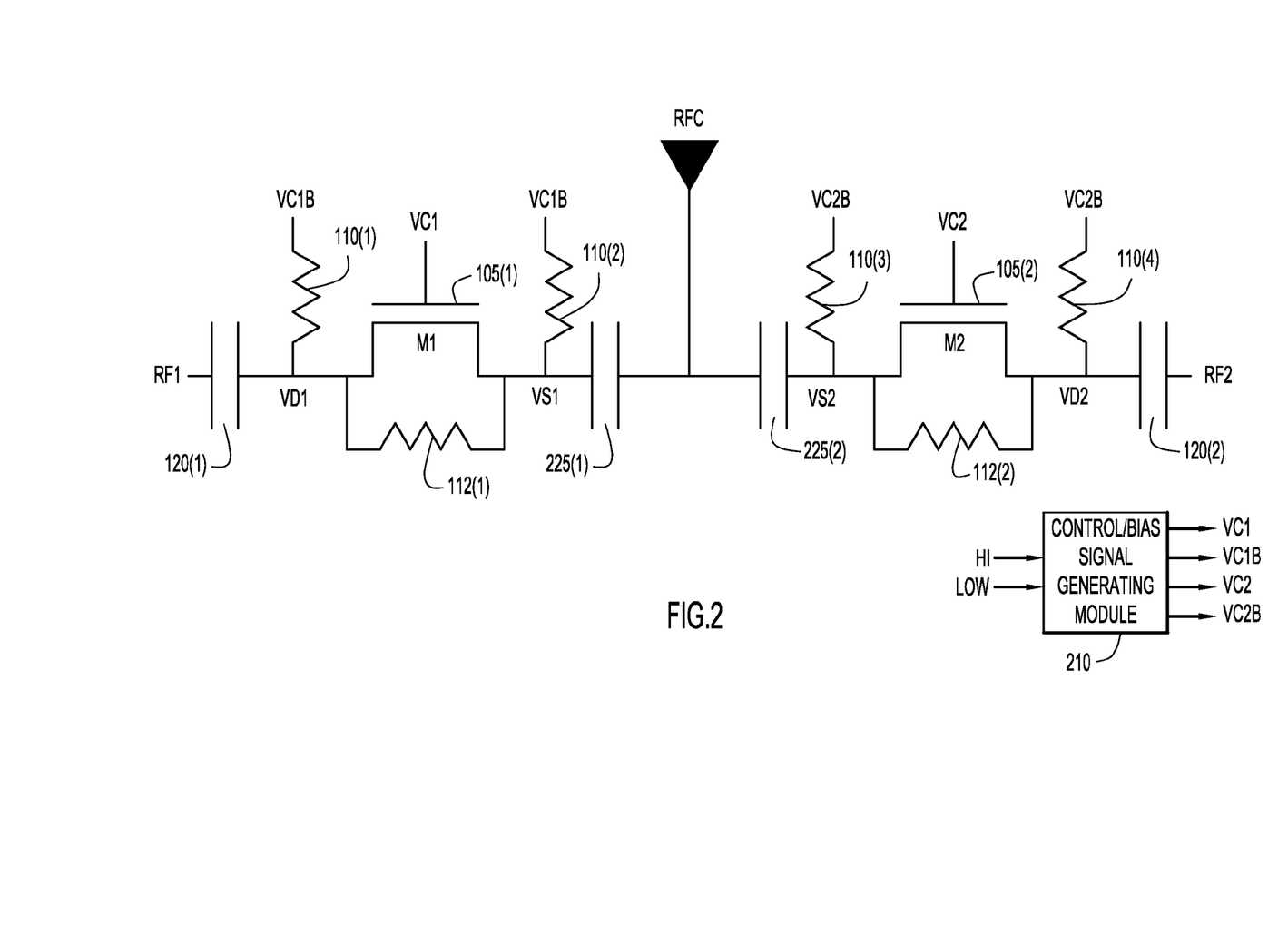
FIG. 2 shows an RF switch including application of an adaptive BIAS voltage to source and drain nodes of a switching element in accordance with an embodiment of the present invention.

In effort to increase the permissible input signal amplitude or voltage swing, the conventional RF switch 100 of FIG. 1 is modified as shown in FIG. 2. RF switch 200 of FIG. 2 is similar to RF switch 100 of FIG. 1 except that DC blocking capacitor 115 is replaced by two separate blocking capacitors 225(1) and 225(2), and instead of supplying a constant VBIAS voltage to the respective source and drain nodes of switching elements M1 and M2, adaptive/changeable bias signals are supplied to the source nodes VS1, VS2 and drain nodes VD1, VD2 of switching elements M1, M2 depending on which RF pathway is to be enabled. These adaptable, changeable bias signals VC1B, VC2B (as well as control signals VC1 and VC2) may be supplied by a control/bias signal generating module 210 having as inputs low and high voltage signals available in the system in which RF switch 200 is incorporated.

The operation of RF switch 200 of FIG. 2 is discussed next with reference to Table 2 below. If it is desired to have an RF signal pass from port RFC to port RF1, switching element M1 is turned ON (such that an AC signal can pass therethrough) and M2 is turned OFF (such that an AC signal cannot pass therethrough). This is accomplished by applying, in the case of a MOSFET, a 3.3 volt control signal VC1 to gate node 105(1) of switching element M1 and simultaneously applying a 0 volt control signal VC2 to gate node 105(2) of switching element M2. Meanwhile, instead of a constant bias signal VBIAS of 1.65 volts being applied to the respective source and drain nodes (as in the prior art), a bias signal VC1B of 0 volt is supplied through resistors 110(1)-110(2) to source node VS1 and drain node VD1 of switching element M1, and a bias signal VC2B of 3.3 volts is supplied through resistors 110(3)-110(4) to source node VS2 and drain node VD2 of switching element M2.

TABLE 2

|  | VC1 | VD1 = VS1 | VGS of M1 | VC2 | VD2 = VS2 | VGS of M2 |
| --- | --- | --- | --- | --- | --- | --- |
| RFC-RF1 | 3.3 V | 0 V | 3.3 V | 0 | 3.3 V | −3.3 V |
| RFC-RF2 | 0 | 3.3 V | −3.3 V | 3.3 | 0 V | 3.3 V |

In this configuration, VGS of switching element M1 is 3.3 volts (3.3-0) and VGS of switching element M2 is −3.3 volts (0-3.3). Accordingly, switching element M1 is turned ON, and switching element M2 is turned OFF.

To have an RF signal supplied at port RFC pass to port RF2, the opposite control signaling is applied to control signals VC1 and VC2, and to bias signals VC1B and VC2B. Specifically, a 0 volt control signal VC1 is applied to gate node 105(1) of switching element M1 and, simultaneously, a 3.3 volt control signal VC2 is applied to gate node 105(2) of switching element M2. Also, bias signal VC1B is maintained at 3.3 volts (thus placing VS1 and VD1 at 3.3 volts) and bias signal VC2B is maintained at 0 volt (thus placing VS2 and VD2 at 0 volt). In this configuration (port RFC→port RF2), VGS of switching element M1 is −3.3 volts (OFF) and VGS of switching element M2 is 3.3 volts (ON).

With the increased reverse bias of VGS in RF switch 200 compared to the reverse bias of VGS of RF switch 100, those skilled in the art will appreciate that the maximum voltage swing that can be handled by RF switch 200 of FIG. 2 is twice 3.3 volts plus twice (i.e., 2 times) the threshold voltage (0.3 volt) of switching elements M1 or M2, i.e., the maximum input voltage swing can be approximately 7.2 volts.

FIG. 3 depicts, at 320, the maximum voltage swing of an input signal to RF switch 200. Here, an input signal to port RFC of RF switch 200 beyond plus/minus approximately 3.6 volts (centered around −3.3 volts) can swamp or overwhelm the switching element that is set in its OFF state. However, such a voltage swing is almost twice that allowable in the configuration of conventional RF switch 100.

The introduction of DC blocking capacitors 225(1) and 225(2) enable the applied bias signals (VC1B and VC2B) to be different from one another since the source nodes of the respective switching elements M1 and M2 are isolated from each other.

Figure 4:
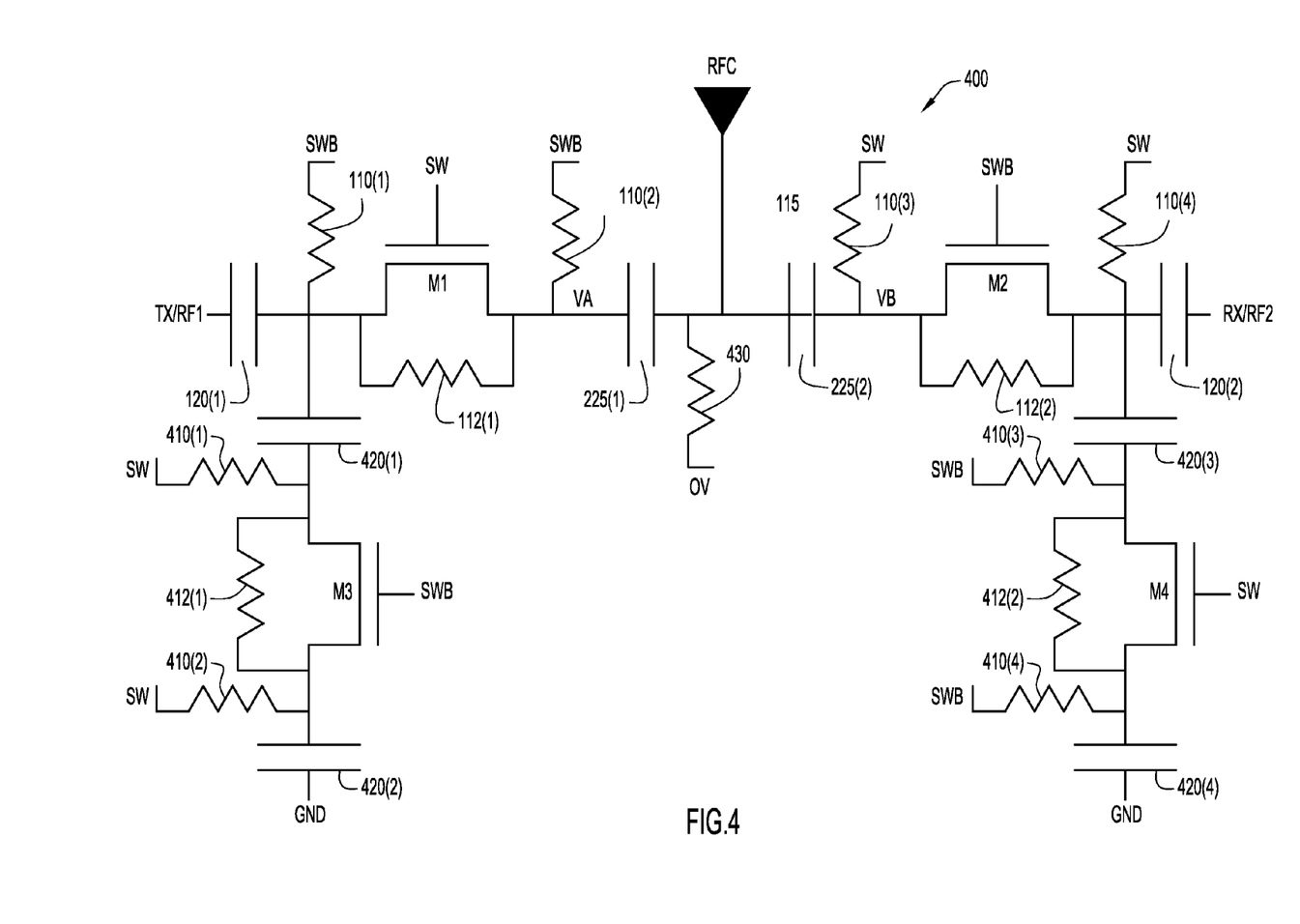
FIG. 4 shows another aspect of an RF switch including circuitry to improve the switching time and isolation of an RF switch in accordance with the present invention.

FIG. 4 shows another aspect of the present invention. RF switch 400 of FIG. 4 is substantially the same as RF switch 200 of FIG. 2 except for the addition of semiconductor switching elements M3 and M4, associated resistors 410(1)-410(4), 412(1)-412(2) and DC blocking capacitors 420(1)-420(4) which, in pairs, respectively isolate switching elements M3 and M4. In this configuration, switching elements M3 and M4, when turned ON, function as shunt paths for the RF pathways with which they are respectively associated.

In addition, RF switch 400 includes resistor 430 via which a 0 volt signal is supplied to the port RFC.

As shown in FIG. 4, port RF1 is designated as a transmit (TX) port and port RF2 is designated as a receive (RX) port. In this configuration, RF switch 400 could be employed in, e.g., a mobile or wireless device with the port RFC connected to an antenna that serves as both a transmit antenna and a receive antenna. When the mobile device is in a transmit mode, the RF pathway leading to port RX/RF2 is preferably resistant to RF energy passing therethrough, i.e. that RF pathway is disabled. If transmitted RF energy were to pass through that pathway, that energy could damage a front end of a receiver of the mobile device. As a result, it is important to be able to isolate the receiver from the transmitter. RF switches like those described herein are designed for that very purpose.

Generally speaking, a signal received at port RFC via an antenna connected thereto is less powerful than a signal being transmitted via port RFC via such an antenna. Thus, in accordance with the instant aspect of the present invention, the control and bias signals supplied to RF switch 400 can be different depending on whether the switch is configured to receive or transmit an RF signal.

With reference to Table 3 below, the different control and bias signals in connection with the operation of RF switch 400 are explained next.

TABLE 3

| TX on (high P1dBm) | SW = 3.3 V | VA = SWB = 0 V | VB = SW = 3.3 V | RX reversed bias = −3.3 V |
|---|---|---|---|---|
| Change to RX (low P1dBm) | SW = 0.5 V | VA = SWB = 2.8 V | VB = SW = 0.5 V | TX reversed bias = −2.3 V |

Preliminarily, it is noted that the bias and control signals SW and SWB in FIG. 4 are equivalent to control signals VC1 and VC2 of FIGS. 1-3 in that they control the gate control nodes of respective semiconductor switching elements M1 and M2 (as well as those of switching elements M3 and M4). However, the voltage levels of the control and bias signals SW and SWB are as explained herein below and indicated in Table 3 above.

Assume RF switch 400 is configured to pass a signal to port RFC to be transmitted. That is, the RF pathway port RFC→port TX/RF1 is selected. This is accomplished by setting SW to 3.3 volts and SWB to 0 volt. In this configuration, switching element M1 is turned ON, switching element M3 is turned OFF (i.e., the shunt is an open circuit) and node VA is 0 volt. Meanwhile, switching element M2 is turned OFF, and switching element M4 is turned ON, thus enabling the shunt path to ground for the port RFC→import RX/RF2 pathway. Node VB is set to 3.3 volts. Thus, in this configuration, M2 is reverse biased at −3.3 volts (VGS=0-3.3).

However, different control and bias signals can be used when disabling the transmit side of the RF switch in favor of the receive side as shown in the second row of Table 3. Specifically, SW can be set to 0.5 volt and SWB can be set to 2.8 volt. In this configuration, VGS of switching element M1 is −2.3 volts (0.5-2.8), and thus OFF. Switching element M3 is turned ON thus enabling that shunt path. On the receive side, VGS of switching element M2 is 2.3 volts (2.8-0.5), and thus is ON, and switching element M4 is turned OFF. The use of different control signals for enabling the RF switch for transmit and receive has a particular benefit. Namely, when transitioning from "TX on" to "RX on" the response time of the RF switch can be improved.

Specifically, when changing from "TX on" to "RX on" capacitor 225(1) is charged from 0 volt to 2.8 volts and capacitor 225(2) is dis-charged from 3.3 volts to 0.5 volt. If the 0/3.3 volt control signals (versus the 0.5/2.8 volt control signals) were used, the charge and dis-charge time would be commensurate with time needed to charge and dis-charge the capacitors between 0 and 3.3 volts.

In sum, using different control voltages to enable/disable RF pathways in RF switch 400 can reduce transient switching time in the context of switching between higher power transmission TX and lower power receiving RX in that the required reversed bias amount can be different for TX transmission (high power with the reverse bias=−3.3V) and RX receiving (low power with reverse bias=−2.3V).

Figure 5:
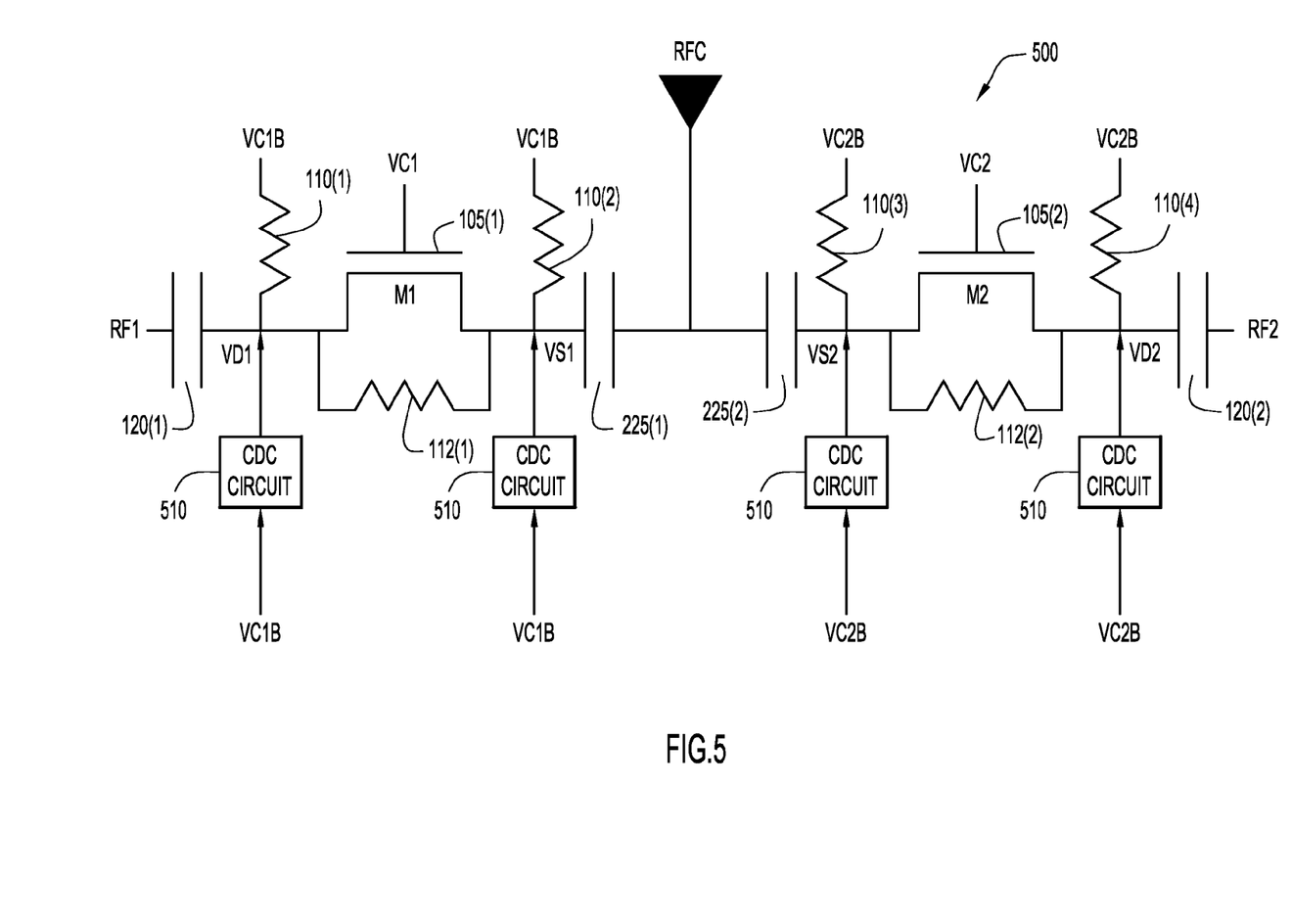
FIG. 5 shows yet another embodiment of an RF switch including a charge-discharge (CDC) circuit employed to still further decrease switching time of the switch in accordance with the present invention.

Reference is now made to FIG. 5. Yet another way to reduce the transient switching time of an RF switch in accordance with an embodiment of the present invention is to provide one or more charge-discharge (CDC) circuits 510 to assist in charging or discharging capacitors 120(1), 120(2), 225(1) and 225(2) upon enabling/disabling a given RF pathway through the switching elements M1 and M2. CDC circuits 510 may be deployed instead of or in addition to the application of different control and bias signals discussed above with respect to FIGS. 2 and 4. RF switch 500 depicted in FIG. 5A is identical to RF switch 200 except for the addition of CDC circuits 510. As will be explained below, CDC circuits 510 are configured to quickly charge or discharge capacitors 120(1), 120(2), 225(1) and 225(2), thereby more quickly attaining the desired VGS value (and resulting ON/OFF state of the semiconductor switching elements) for the given desired state of RF switch 500. At a high level, each CDC circuit 510 operates to provide a low resistance path to speed the charging or dis-charging of the several DC blocking capacitors.

Figures 6A, 6B, 6C:
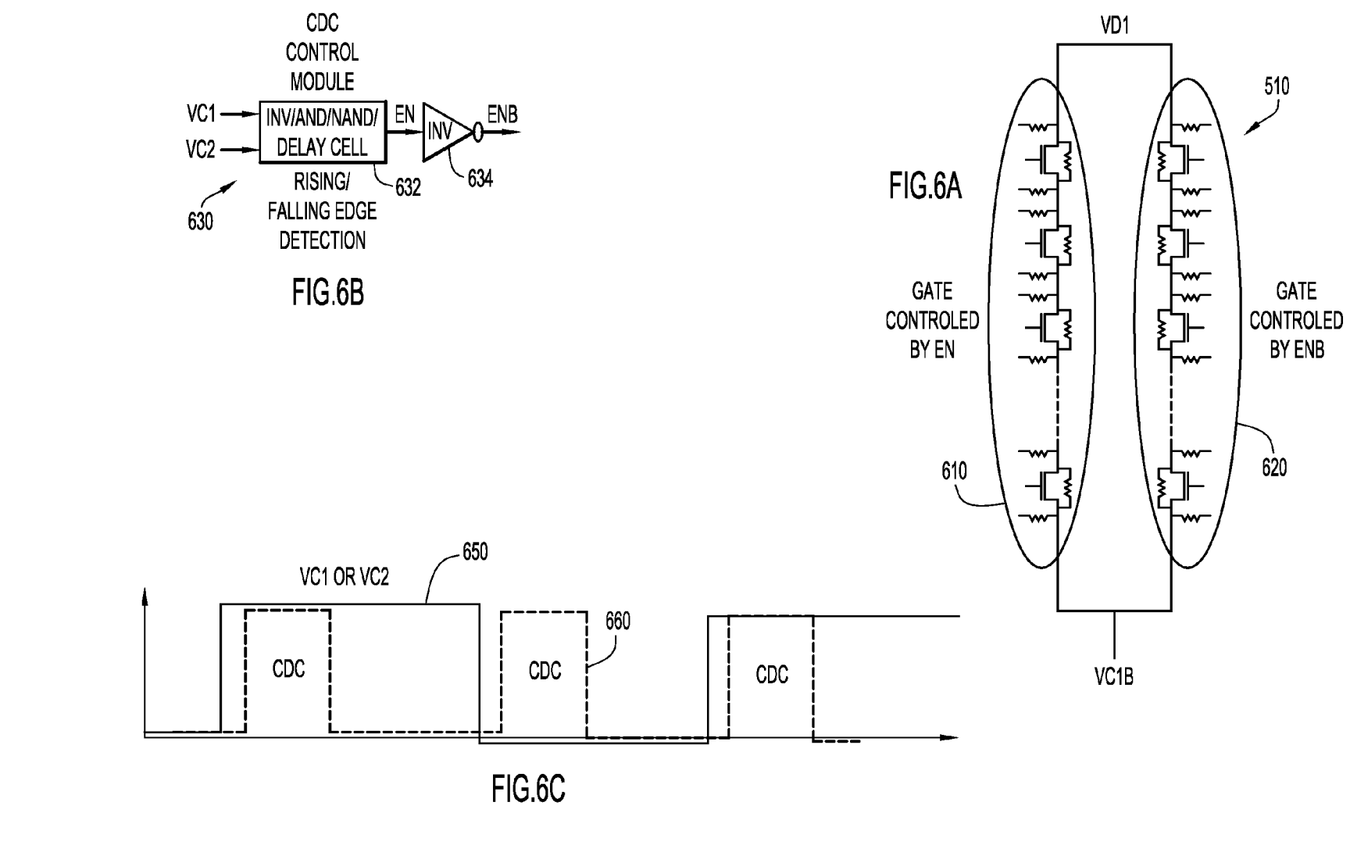
FIGS. 6A-6C show details of the CDC circuit, a CDC control circuit and a timing diagram in connection with the CDC circuit, respectively, in accordance with an embodiment of the present invention.

An example of a possible implementation of CDC circuit 510 is shown in FIG. 6A. In this implementation, CDC circuit 510 comprises two sets of a plurality of series connected or stacked CMOS transistors in parallel with each other. The first set 610 may be N-type transistors arranged in a chain between, e.g., drain node VD1 and bias control signal VC1B. The second set 620 may be P-type transistors likewise arranged in a chain between drain node VD1 and bias control signal VC1B. The respective gate control nodes of the respective transistors may be controlled by a CDC control module 630. The same circuitry may be deployed between bias control signals VS1 and VC1B, VS2 and VC2B and, VD2 and VC2B.

In one possible implementation, CDC control module 630 may comprise a rising/falling edge detection unit 632 comprising appropriate logic including at least a delay cell, the purpose of which will be explained below. Inputs to the rising/falling edge detection unit 632 may be control signals VC1 and/or VC2. The output of rising/falling edge detection unit 632 is an enable signal (denoted as "EN"). Enable signal EN is supplied to an inverter 634, which outputs an inverse enable signal denoted as ENB.

As indicated in FIG. 6A, the enable signal EN is supplied to the gate control nodes of the respective transistors in the first set 610 of a plurality of transistors and the an inverse enable signal ENB is supplied to the gate control nodes of the respective transistors in the second set 620 of a plurality of transistors.

FIG. 6C shows a timing diagram of control signal VC1 or VC2 650 switching between high and low. Superimposed on signal 650 is the broken line is the timing 660 or application of CDC circuit 510, as controlled by the enable signal EN and inverse enable signal ENB. Specifically, as the rising edge of, e.g., control signal VC1 is detected by rising/falling edge detection unit 632, the enable signal EN is applied to the gates of the first set of a plurality of transistors 610, thus turning those transistors ON. The inverse enable signal ENB is applied to the gates of the second set of a plurality of transistors 620, thus also turning those respective transistors ON.

With reference to the leftmost side of the plot in FIG. 6C, assume control signal VC1 is low, meaning that the RF pathway between ports RF1 and RFC is dis-abled. In this configuration bias control signal VC1B may be set to, e.g., 3.3 volts, which means that capacitors 120(1), 225(1) are charged to that same voltage. When transitioning that RF pathway to an enabled state, control signal VC1 goes high, e.g., 3.3 volts, and bias control signal VC1B is set to low, e.g. 0 volt. However, since the capacitors 120(1), 225(1) are already charged to 3.3 volts, VGS at the instant the 3.3. volt control signal VC1 is applied would be zero (i.e., 3.3-3.3) and thus VGS would not be greater than the threshold voltage $V_{th}$ to turn switching element M1 ON, let alone placing switching element M1 in an overdrive state, which is desirable in switching applications.

To more quickly increase VGS into an overdrive state, CDC circuit 510 is used to quickly discharge capacitors 120(2), 225(2) for a period of time, set by CDC control module 630, and as shown by CDC timing line 660. Specifically, when control signal VC1 goes high, bias control signal VC1B goes low (see discussion of FIG. 2 above). And, during the application of the CDC circuit 510, the enable signal EN is applied to the gates of the first set 610 of the plurality of transistors and the inverse enable signal ENB is applied to the gates of the second set 620 of the plurality of transistors. As such, during CDC circuit application, a very low resistance pathway (compared to via resistors 110(1), 110(2)) is provided with bias control signal VC1B at 0 volt, thus allowing for, e.g., DC blocking capacitor 120(1) to quickly discharge from 3.3 volts to 0 volt (the potential of bias control signal VC1B). The same dis-charging occurs for DC blocking capacitor 225(1).

As indicated in the timing diagram of FIG. 6C, application of the CDC circuit is only for a limited amount of time and may be dependent on how long it takes for the respective DC blocking capacitors to be discharged. The delay element within CDC control module 632 provides the desired amount of time over which to apply the effects of CDC circuit 510.

The discussion above concerned transitioning an RF pathway from dis-abled to enabled and discharging DC blocking capacitors. However, those skilled in the art will appreciate that CDC circuit 510 also assists in charging DC blocking capacitors when a given RF pathway is transitioning from enabled to dis-abled. In the enabled case, bias control signal VC1B is set to e.g., 0 volt. This means that the DC blocking capacitors are likewise at 0 volt before the transition from enabled to dis-abled. When transitioning from enabled to dis-abled, bias control signal VC1B goes from low to high (e.g., 0 to 3.3 volts). At this point, it is desirable to quickly charge the capacitors so that the reverse bias of the switching element is quickly increased to ensure a quick disabling of that RF pathway.

Accordingly, when bias control signal VC1B goes high and the CDC circuit is enabled, a low resistance path to a 3.3 volt source (bias control signal VC1B) is applied directly to the DC blocking capacitors in the selected RF pathway.

Indeed, in accordance with a preferred embodiment, CDC circuit 510 is simultaneously applied to the RF pathway transitioning from enabled to dis-abled and to the RF pathway transitioning from dis-abled to enabled, as shown in FIG. 5, thereby reducing the time needed to switch the RF switch.

Figure 7:
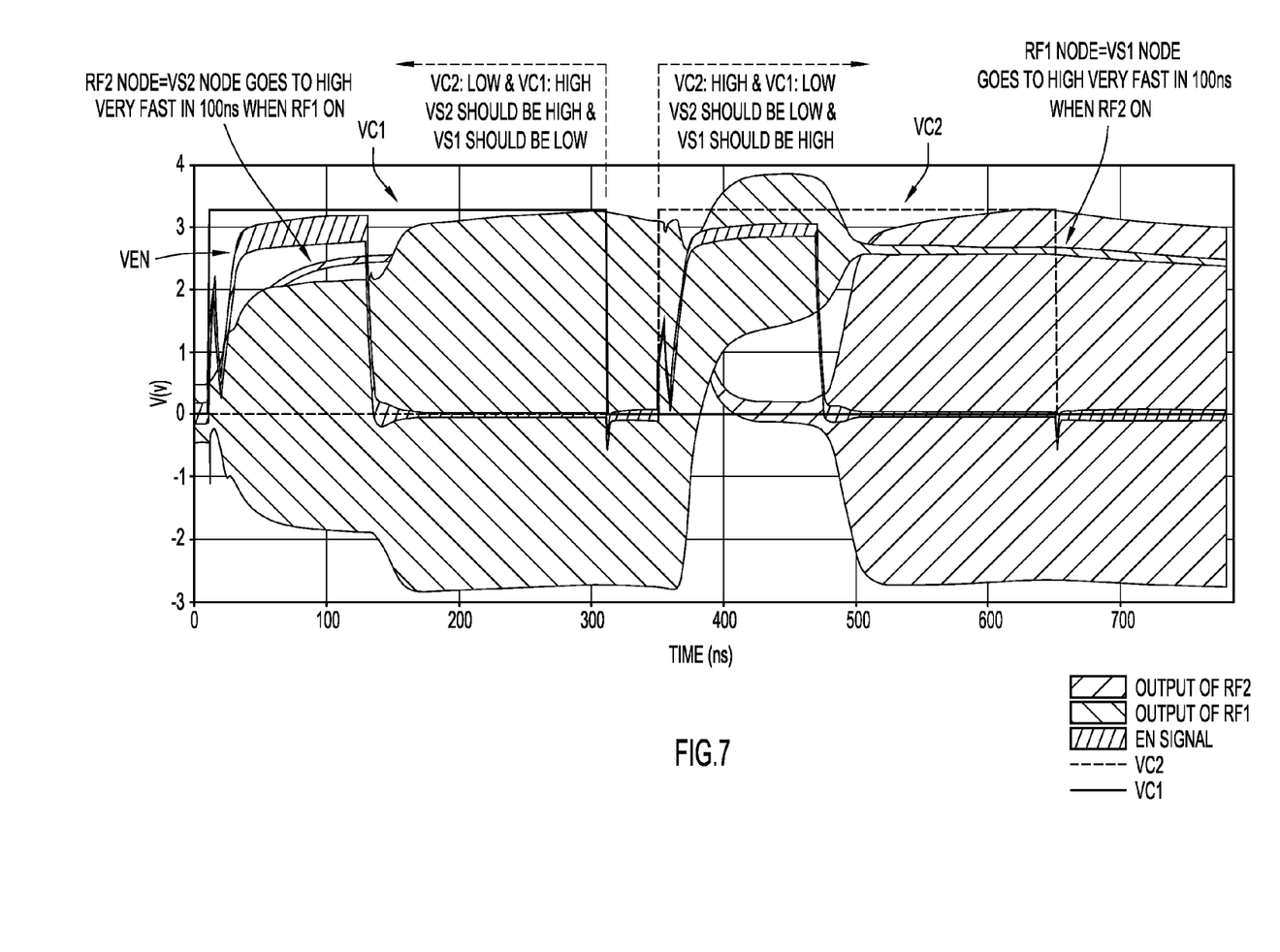
FIG. 7 shows a simulation of RF switch operation using the CDC circuit.

FIG. 7 depicts a simulation of outputs at ports RF1 and RF2 employing the CDC circuit 510 as described herein. As shown, soon after control signal VC1 goes high, the enable signal EN goes high for a relatively short period of time (about 100 ns). In the simulation, control signal VC2 is low. In such a state, bias control signal VC2B should be high, also causing VS2/VD2 to be high (see discussion of FIG. 2). In fact, the more quickly nodes VS2/VD2 reach a high state (with a simultaneous application of a low control signal VC2) the more quickly the switch can isolate the port RF2 RF pathway. As shown in FIG. 7, VS2 reaches a high state within about 100 ns.

Likewise, as further shown, when control signal VC1 is low and control signal VC2 is high, the RF pathway towards port RF2 is enabled. In this case, it is desirable to have VGS of switching element M1 reversed bias and OFF as quickly as possible. As shown, in FIG. 7, when control signal VC2 goes high, the CDC circuit is enabled with VEN and VS1/VD1 are quickly set to high within about 100 ns.

Simulations have shown that without the use CDC circuit 510 in a switch configuration like that shown by 500 in FIG. 5, the transient time of the source and drain nodes may be on the order of greater than 3

Figure 8:
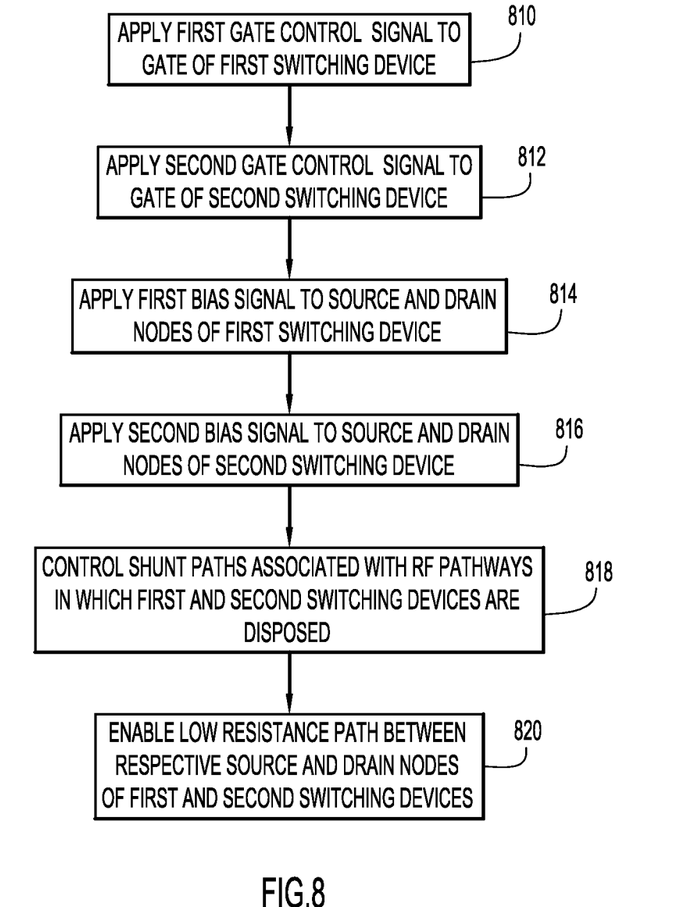
FIG. 8 depicts a series of operations that may be performed in accordance with embodiments of the present invention.

FIG. 8 depicts a series of operations that may be performed to operate an RF switch in accordance with embodiments of the present invention. Although the several steps are shown in a particular sequence, those skilled in the art will appreciate that the depicted sequence is merely an example, and in fact, one or more of the steps may be performed substantially simultaneously, or in a different order. At 810, a first gate control signal is applied to a first switching element. At 812, a second gate control signal is applied to a second switching element. At 814, a first bias signal is applied to source and drain nodes of the first switching element. At 816, a second bias signal is applied to source and drain nodes of the second switching element. At 818, shunt paths associated with RF pathways in which the first and second switching elements are disposed may be controlled in an effort to better isolate a given RF pathway. Finally, at 820, a low resistance path may be enabled between respective source and drain nodes of the first and second switching elements to reduce the transient switching time of the RF switch by promoting quick charging and dis-charging of DC blocking capacitors in electrically connected to source and drain nodes of the first and second switching devices.

While the invention has been described in terms of what is presently considered to be the most practical and preferred embodiments, it is to be understood that the invention needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. A radio frequency switch, comprising:
    a common port;
    a first port;
    a second port;
    a first semiconductor switching element disposed in a first RF pathway between the common port and the first port;
    a second semiconductor switching element disposed in a second RF pathway between the common port and the second port;
    a first pair of direct current (DC) blocking capacitors disposed to isolate the first semiconductor switching element in the first RF pathway;

a second pair of DC blocking capacitors disposed to isolate the second semiconductor switching element in the second RF pathway; and a charge-discharge (CDC) circuit in electrical communication with at least one node, of one of the DC blocking capacitors, that is located between the one of the DC blocking capacitors and one of the first semiconductor switching element or the second semiconductor switching element and configured to charge or discharge, via a low resistance path, the one of the DC blocking capacitors with direct current dependent on whether the first or the second RF pathway in which the at least one of the DC blocking capacitors is disposed is enabled.

2. The RF switch of claim 1, comprising a plurality of CDC circuits, respectively being in electrical communication with nodes of the first and second pairs of DC blocking capacitors that are shared with the respective first and second semiconductor switching elements.

3. The RF switch of claim 2, wherein each of the nodes of the first and second pairs of DC blocking capacitors that are shared with the respective first and second semiconductor switching elements is in electrical communication with a CDC circuit.

4. The RF switch of claim 1, wherein the CDC circuit comprises a plurality or series connected transistors.

5. The RF switch of claim 4, wherein the CDC circuit comprises a pair of sets of series connected transistors, a first set having a first conductivity type and a second set have a second conductivity type different from the first conductivity type.

6. The RF switch of claim 1, wherein the first and second switching elements are biased to a predetermined bias voltage, and the CDC circuit is configured to receive the bias voltage as an input.

7. The RF switch of claim of claim 6, wherein a first CDC circuit in electrical communication with the first RF pathway receives as an input a first bias voltage employed to enable the first RF pathway, and a second CDC circuit in electrical communication with the second RF pathway receives as an input a second bias voltage employed to disable the second RF pathway.

8. The RF switch of claim 1, further comprising a CDC control module configured to supply a control signal to the CDC circuit to enable the CDC circuit to charge or dis-charge the at least one of the DC blocking capacitors for predetermined time.

9. The RF switch of claim 8, wherein the control signal is triggered based on a rising edge of a gate control signal supplied to at least one of the first or second semiconductor switching elements.

10. The RF switch of claim 8, wherein the CDC control module is configured to enable the CDC circuit for about 100 ns.

11. A method of operating an RF switch, comprising:
operating the RF switch in a first state with a first RF pathway thereof one of enabled or disabled;
detecting that the RF switch is transitioning the first RF pathway to a second state wherein the first RF pathway is the other of enabled or disabled; and
responsive to the detecting, establishing a low resistance direct current path between a voltage source and a node located between a direct current (DC) blocking capacitor and a semiconductor switching element in the first RF pathway of the RF switch.

12. The method of claim 11, wherein detecting comprises detecting a gate control voltage that is applied to a switching device in the first RF pathway.

13. The method of claim 11, wherein the low resistance pathway is established for a predetermined amount of time.

14. The method of claim 13, wherein the predetermined amount of time is about 100 ns.

15. The method of claim 11, further comprising establishing the low resistance path by turning ON a semiconductor switching device disposed between the voltage source and the DC blocking capacitor.

16. The method of claim 15, wherein the semiconductor switching device is one of a plurality of series connected semiconductor switching devices.

17. The method of claim 11, wherein the voltage source is obtained from a bias voltage signal that is applied to the first RF pathway.

18. The method of claim 11, further comprising:
detecting that the RF switch is transitioning a second RF pathway to one of enabled or disabled; and
responsive to the detecting that the RF switch is transitioning the second RF pathway, establishing a low resistance path between another voltage source and a DC blocking capacitor in the second RF pathway of the RF switch.

19. The method of claim 18, wherein the another voltage source is a bias voltage signal that is applied to the second RF pathway.

20. The method of claim 11, further comprising establishing a low resistance path between at least two voltage sources and a plurality of DC blocking capacitors in the RF switch.

* * * * *